United States Patent [19]

Prince

[11] 4,092,549
[45] May 30, 1978

[54] CHARGE COMPARATOR

[75] Inventor: Paul R. Prince, Fountain Valley, Calif.

[73] Assignee: Hughes Aircraft Company, Culver City, Calif.

[21] Appl. No.: 752,703

[22] Filed: Dec. 20, 1976

[51] Int. Cl.² .............................................. H03K 5/00
[52] U.S. Cl. ................................ 307/221 D; 307/360; 307/362; 357/24
[58] Field of Search ................... 307/221 D, 362, 354, 307/360, 279; 357/24

[56] References Cited

U.S. PATENT DOCUMENTS

| 3,838,438 | 9/1974 | Silversmith et al. ............ 307/221 D |
| 3,858,232 | 12/1974 | Boyle et al. ............................ 357/24 |

Primary Examiner—John Zazworsky
Attorney, Agent, or Firm—W. H. MacAllister; Walter J. Adam

[57] ABSTRACT

The charge comparator, in accordance with the inventon, illustrated as a p-channel device utilizes charge-transfer devices (CTD) that provide positive feedback to a preceding storage well so that when a small charge is transferred over a charge barrier and then under a floating electrode, the resultant voltage increase on the floating electrode is fed back in a positive sense and effectively raises the bottom of the preceding storage well. This action quickly results in a larger charge transfer over the charge barrier into the well under the floating electrode and the system becomes regenerative. Thus, the entire preceding storage well charge is transferred over the barrier into the potential well beneath the floating electrode and a digital 1 is created. If this regenerative operation is not triggered, as a result of the input signal not reaching a reference level, a digital zero output is provided. The comparator first establishes a reference level in the preceding storage well by setting the charge barrier to a reference level while the floating electrode is clamped. The input signal is then applied to the electrode associated with the charge barrier and the floating electrode is unclamped. The level of the input signal determines whether charge flows over the barrier and thus under the floating electrode to develop a digital 1 output.

16 Claims, 4 Drawing Figures

CHARGE COMPARATOR

BACKGROUND OF THE INVENTION

1. Field of the Invention

This invention relates to signal comparators and particularly to a charge-transfer device signal comparator utilizing regenerative feedback to provide a comparator of small size, low power consumption and fabrication compatability with other CTD devices, such as charge coupled devices (CCD) and bucket brigade devices.

2. Description of the Prior Art

Analog-to-digital converter systems, all of which require comparators, are generally of the discrete or monolithic circuit type and dissipate about 500 to 700 milliwatts for an 8 bit system operating at 1 megabit per second. A CCD comparator would provide similar performance and only dissipate in the order of 10 milliwatts. It would be a substantial advance to the art if an accurate and reliable CTD signal comparator were provided that operates with a minimum of power and has compatability with other CTD devices.

SUMMARY OF THE INVENTION

The signal comparator of the invention utilizes CTD (charge-transfer device) structures with a CTD channel having a source of charge, a preceding electrode for establishing a storage well, a charge barrier electrode for establishing a potential barrier of a reference signal level, a floating electrode for establishing a charge receiving well and sensing the received charge, and output electrodes for removing charge of the previous period and the excess charge from the preceding well. The preceding well is first filled with charge with the reference level applied to the barrier electrode and the floating electrode clamped to a predetermined voltage. The clamp is then removed from the floating electrode and the input signal is applied to the barrier electrode. If the input signal exceeds the reference voltage level, a small charge is transferred under the floating electrode with the resultant voltage increase on the electrode (for a p-channel device) being fed back through voltage buffering means such as a source follower to effectively raise the bottom of the preceding well or bucket. The result is a larger charge transfer over the barrier and under the floating electrode and the system becomes regenerative so that the entire charge within the preceding well is transferred over the barrier and into the potential well under the floating electrode and a digital 1 is created. If the input signal is at a level so that the regenerative action does not occur, a digital zero condition is provided.

It is therefore an object of this invention to provide a highly reliable signal comparator utilizing charge-transfer devices.

It is another object of this invention to provide a low power, high speed CCD charge comparator.

It is still another object of this invention to provide an improved CTD signal comparator that operates with positive feedback to rapidly determine the digital value of an analog input voltage relative to a reference level.

It is a further object of this invention to provide a CTD charge comparator that allows analog-to-digital converters to be fabricated dissipating a substantially small amount of power and being compatible with other CTD devices.

BRIEF DESCRIPTION OF THE DRAWINGS

These and other objects, features and advantages of the invention as well as the invention itself will become apparent to those skilled in the art in the light of the following detailed description taken in consideration with accompanying drawings wherein like reference numerals indicate like or corresponding parts throughout the several views wherein.

DESCRIPTION OF THE PREFERRED EMBODIMENT

Figure 1:
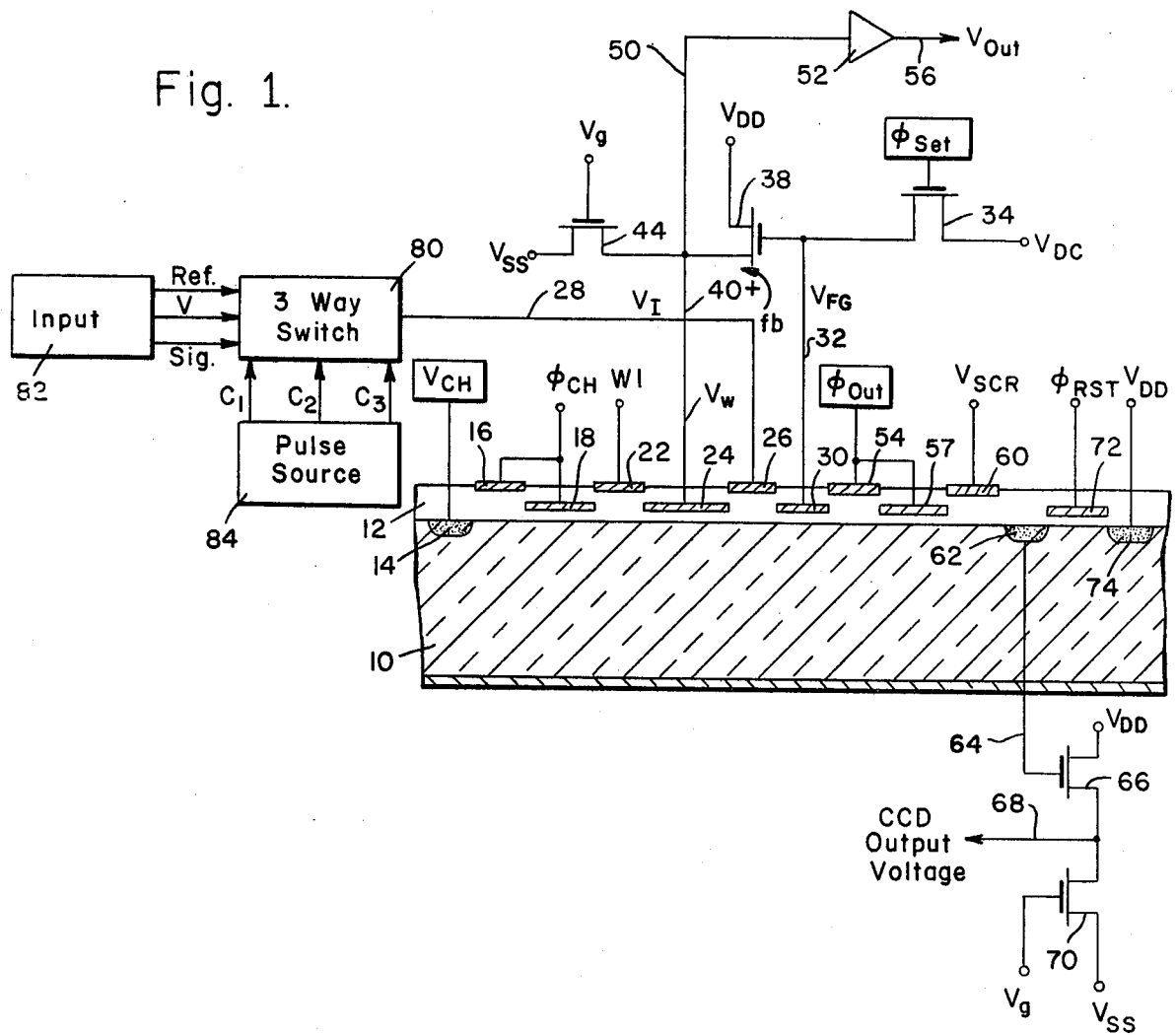
FIG. 1 is a schematic circuit, block and a CCD structural diagram showing a charge comparator in accordance with the invention.

Referring first to FIG. 1, the CCD charge comparator, illustrated as a p-channel device in accordance with the invention, includes a suitable substrate 10 of an n-type material with an oxide region 12 deposited on the surface thereof to form a single channel with suitable stops (not shown) provided along the edges of the channel as is well known in the art. A source of charge for the comparator is provided by a p+ diffusion 14 coupled to a negative potential $V_{CH}$ followed by charge control electrodes 16 and 18 responsive to a $\phi_{CH}$ signal. Next in turn is an electrode 22 to provide an input barrier to the input current in response to a potential W1. A charge-storage well electrode 24 is provided followed by a reference and input charge barrier electrode 26 receiving the reference signal and input signal $V_I$ on lead 28. A floating electrode 30 is then provided for sensing charge flowing over the barrier under electrode 26 and is coupled to a lead 32 which in turn is coupled through a MOSFET switch 34 to a voltage $V_{DC}$ with the switch being controlled by a $\phi_{SET}$ signal from a suitable source. The lead 32 is also coupled to the input of a voltage buffer such as the gate of a MOSFET source follower 38 having its drain terminal coupled to a voltage $V_{DD}$ and its source terminal coupled through a lead 40 to the storage well electrode 24 for developing the regenerative action. The lead 40 is also coupled to a current source switch 44 having a fixed voltage $V_G$ applied to its gate terminal and having its source terminal connected to a supply voltage $V_{SS}$. The output signal may be provided on a lead 50 coupled from the lead 40 through a suitable amplifier 52 to provide an output voltage $V_{OUT}$ on an output lead 56, which signal may then be applied to a suitable sampling circuit, not shown, to provide a digital sampled output.

The floating electrode 30 may be followed by electrodes 54 and 57 coupled to a pulse source $\phi_{OUT}$ for removing the excess charge derived from the potential well under the electrode 24. Next in line is an electrode 60 coupled to a suitable voltage $V_{SCR}$ for aiding in the output charge transfer. Next along the channel, a diffusion region 62 may be provided coupled through a lead 64 to the gate of a MOSFET source follower 66 in turn coupled between a potential source $V_{DD}$ and an output lead 68 that may provide a CCD output voltage. The output lead 68 is also coupled to a MOSFET current source 70 having its source terminal coupled to the voltage $V_{SS}$ and its gate coupled to a voltage $V_G$ to provide a suitable current. It is to be noted that the output voltage on the lead 68 may be utilized in some arrangments, in accordance with the invention, but the output voltage on the lead 56 is preferable. The p+ diffusion 62 is followed by a buried electrode 72 coupled to a source of pulses $\phi_{RST}$ for resetting the CCD output by tranferring previous charges therefrom during each bit period. A p+ diffusion 74 is provided as a current sink for charges transferred thereto and is coupled to a suitable negative potential $V_{DD}$.

The input signal which sequentially is a reference voltage, a zero voltage and the input analog signal is provided by a three-way switch 80 coupled to the lead 28 and responsive to a reference signal, a zero volt signal and the analog input signal from a source 82. The three-way switch 80 responds to pulses $C_1$, $C_2$ and $C_3$ from a suitable pulse source 84 to respectively gate the reference signal, the zero volt signal and the analog signal from the source 82 to the input lead 28 during each comparison operation.

Figure 1A:
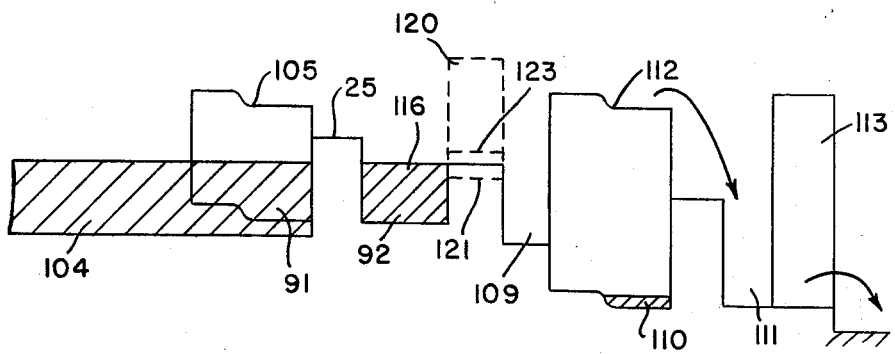
FIG. 1a is a schematic diagram showing the surface potentials for further explaining the operation of the charge comparator of FIG. 1.
Figure 2:
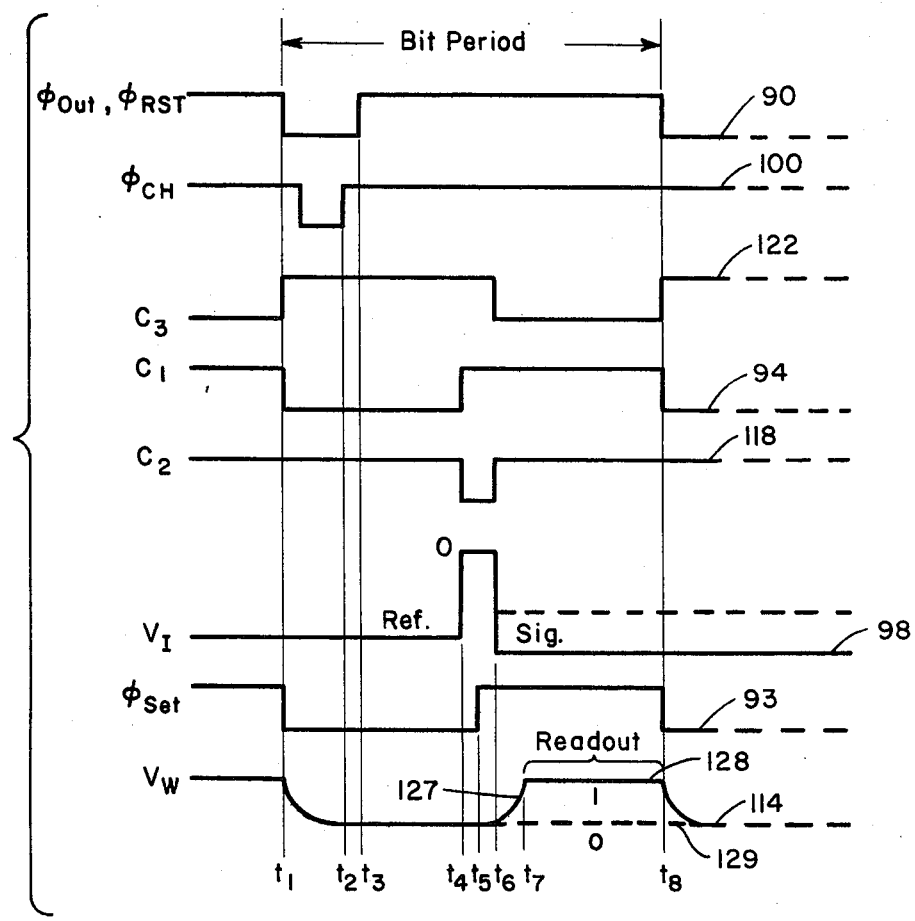
FIG. 2 is a schematic diagram showing waveforms of voltage as a function of time and for further explaining the operation of the charge comparator of FIG. 1.

Referring now to FIGS. 1a and 2, as well as to FIG. 1, the operation of the charge comparator will be explained in further detail. At time $t_1$, at the start of a bit period, $\phi_{RST}$ of a waveform 90 goes low and $\phi_{OUT}$ goes low as shown by the same waveform 90, to provide conditions for the previous bit (N−1) charge and present bit (N) excess charge to be removed from a well 109 under the electrode 30; and earlier charge (bit N−2) to be removed from well 111 under diffusion 62. Also, at time $t_1$, the $\phi_{SET}$ pulse of waveform 93 goes low so that the gate 34 is closed and electrode 30 is clamped to voltage $V_{DC}$. In response to the $C_1$ pulse of a waveform 94, the reference voltage is applied as $V_I$ on the input lead 28, as shown by a waveform 98. In response to the $\phi_{CH}$ pulse of a waveform 100 going low shortly after time $t_1$, the potential profile or barrier at 105 falls so that a charge from the source 104 is transferred into the well 91 thereby formed. At time $t_2$, the $\phi_{CH}$ pulse goes up at the electrode pair and one full bucket of charge is captured or scooped up and transferred into the well 92. The amount of charge that is transferred is determined by the capacity or size of the buried electrode 18 which is of sufficient size to overfill the well 92 and spill excess charge over the $V_I$ barrier provided by electrode 26. The excess charge is transferred under the floating electrode 30 and into a well 110 under the $\phi_{OUT}$ electrode 57. At time $t_3$, the well 92 is filled to a level 116 as established by the reference voltage with the excess charge passing into a well 110 having a barrier under the $V_{SCR}$ electrode 60. The pulse $\phi_{OUT}$ goes up at a time $t_3$ to establish the well 109 and to transfer the excess charge and the charge of the previous time period along to well 111.

At time $t_4$, the input signal $V_I$ goes up in response to a $C_2$ signal of a waveform 118 to establish a barrier 120 as a protection against clock pickup starting the regenerative action at time $t_5$. The $\phi_{SET}$ pulse of a waveform 93 goes up at a time $t_5$ to remove the clamp on the electrode 30 so that the electrode is floating. Also in response to the $\phi_{SET}$ pulse going up, the voltage $V_W$ of a waveform 114 on the electrode 24, which defines the bottom of the well 92, is following the potential variation of the floating electrode 30 through the action of the source follower 38.

At a time $t_6$, the potential of the waveform 98 is lowered in response to the rise of the pulse of the waveform 118 and the fall of the pulse of the waveform 122, to a level near the level 116 of the well 92. The analog input signal of the waveform 98 in response to the $C_3$ pulse of a waveform 122 is established on the $V_I$ electrode 26. If the level of $V_I$ goes down to the level of 116, the action may be indeterminate. If the level of $V_I$ goes down to a level 123 above the level 116, then no regenerative action is triggered which is a digital zero condition as shown dotted by the waveforms 98 and 114. However, if $V_I$ is at a level below 116, such as a level 121, then carriers flow over the potential barrier established by $V_I$ into the well under the floating electrode 30. It is to be noted that $\phi_{OUT}$ of the waveform 90 is high to establish the well under the electrode 30. The carriers spilling over the barrier 25 and under the sense electrode which are holes for the illustrated p-channel CCD cause a positive potential increase on the electrode 30 and a corresponding positive voltage increase is transferred to $V_W$ on the lead 40 and electrode 24 due to the action of the source follower 38. The number of carriers spilled into the well 109 causes the charge level in the well 92 to drop from level 116 toward 121. However, the potential increase on electrode 24 causes the bottom of well 92 to rise and the carrier level to rise above level 121 spilling more carriers into the well under the electrode 30. The size of the well 92 is larger than the size of the well 109 under the floating electrode 30 to insure that, even with somewhat less than unity gain in the source follower 38, more carriers spill over the barrier due to feedback than in the original spillover action. This greater than unity positive feedback creates a rapid increase in the voltage $V_W$ on the electrode 24 which empties the entire charge packet from the well 92 over the barrier 25 and under the floating electrode 30 creating a rapid voltage jump in $V_W$ on the lead 50, the regenerative feedback action being indicated at 127 in the waveform 114. When this regenerative action occurs, a digital 1 voltage, shown at 128 on the waveform 114, occurs but if the input signal on the lead 28 is larger than the reference, the regenerative action does not occur and a digital zero indicated at 129 is provided on the lead 40. The digital signal $V_W$ on the lead 40 appears on the output lead 56 and may be sampled at any appropriate time between $t_7$ and $t_8$. At time $t_8$, the $\phi_{SET}$ pulse of the waveform 92 drops; the pulse of the waveform 90 drops; the pulse of the waveform 122 rises; the pulse of the waveform 94 drops; and the operation is ready for the next bit period.

Thus, in the operation, the value of $V_{FG}$ and therefore $V_W$ are fixed when the $\phi_{SET}$ pulse is on. However, after $\phi_{SET}$ rises and $V_I$ drops to the signal potential, an unstable condition is provided since any small charge entering under electrode 30 causes $V_{FG}$ to raise since the electrode is floating. When $VF_G$ raises, $V_W$ follows (AC gain $\simeq$ 0.90, for example) but this raises the bottom of the bucket under $V_W$. As long as no charge enters under electrode 30, positive feedback will not occur. However, if a small charge does enter under electrode 30 due to a slight decrease of the potential under electrode 26, below potential 116, as established by the reference voltage of the signal $V_I$, those few carriers will cause $V_W$ to raise. If the area of $V_W$ is greater than the area $V_{FG}$ over the gain of the source follower, a positive feedback with a loop gain greater than 1.0 exists and quickly all charge under $V_W$ will be dumped into the well under the floating and sensing electrode 30. The source follower 38 has good bandwidth and the structure can be made very small so that high speeds are possible. As shown in FIG. 1a, when the input signal $V_I$ is at a level such as 121 regenerative action occurs and a digital one is created and if the input signal is at a level such as 123, the regenerative action does not occur and a digital zero is maintained on the lead 40. In some clocking and interconnection arrangements, in accordance with the invention, the output voltage may be taken at 62 and applied to the output lead 68.

The concepts of the invention include other suitable arrangements such as having the reference voltage of the signal $V_I$ at a fixed level and the voltage $V_{DC}$ as the analog input voltage.

Figure 3:
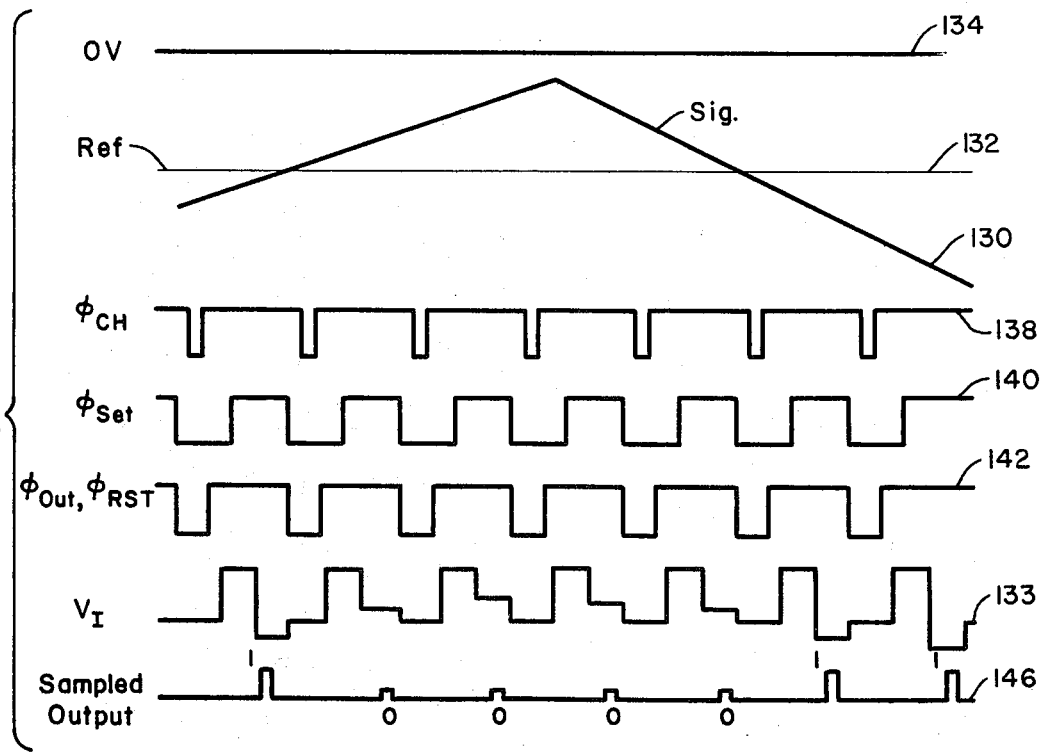
FIG. 3 is a schematic diagram showing waveforms of voltage as a function of time for further explaining the continuous operation of the charge comparator of FIG. 1.

Referring now to FIG. 3, the continuous operation of the charge comparator in accordance with the invention will be further explained. The input signal $V_I$ of the waveform 133 is formed of a reference level 132, a zero volt level 134 for preventing any effect of clock pickup and a signal 130, in that sequence, for each input signal. The $\phi_{CH}$, the $\phi_{OUT}$ (and $\phi_{RST}$) and the $\phi_{SET}$ pulses are shown by respective waveforms 138, 142 and 140 in their relative time positions with the input signal $V_I$. During a first pulse period of the signal $V_I$, the analog input is below the reference, during a second pulse period it is above the reference and during a third pulse it is further above the reference to form the digital sampled output signals indicated on a waveform 146. The sampling circuit, not shown, samples the output 56 at appropriate times as shown between $t_7$ and $t_8$ of waveform 114 of FIG. 2. At the time of a sixth and seventh pulse periods of the signal $V_I$, the analog input is below the reference and the charge comparator responds to provide output digital bits of the waveform 146, the zero values representing the nonfeedback condition and the 1 values representing a regenerative positived feedback condition occurring. Thus, it can be seen that the charge comparator may operate over a plurality of bit periods to generate binary digital values of the analog input signal. It is to be noted that in other arrangements, in accordance with the invention, the reference level 132 may be an AC or pulsed signal within the scope of the invention and the charge comparator output may be feedback to input 82 to control changes to the reference or signal on successive bit periods to form analog-to-digital conversion.

Thus, there has been described a signal comparator using charge-coupled devices to provide small size, low power and fabrication compatibility with other CCD devices. The system provides positive feedback to a preceding storage well so that when a small charge is injected under a floating electrode in response to an analog input signal, the resultant voltage increase on the electrode is fed back and effectively raises the bottom of the preceding storage well, from which the output signal may be read. The output signal may also be read as a CCD signal downstream from the floating electrode within the scope of the invention. It is furthermore within the scope of this invention to provide voltage gain within the voltage buffer such as replacing amplifier 38 with a non-inverting amplifier, to effect the greater than unity gain feedback. Positive feedback may also be provided by inverting the floating gate signal and connecting it to the barrier so that regeneration occurs through the lowering of the charge barrier, all within the scope of the invention. It is to be understood that although the concepts of the invention are illustrated as a p-channel device having an n-type substrate with positive carriers, the concepts of the invention are equally applicable to n-channel devices with p-type substrates having electrons as the charge carriers, and applies to both CCDs and bucket brigade devices.

What is claimed is:

1. An arrangement for comparing an input signal from a source with a reference signal comprising:
   a CTD channel,
   a first electrode in said CTD channel,
   a second electrode in said channel sequentially positioned along said channel from said first electrode and coupled to said source,
   a third electrode in said channel sequentially positioned along said channel from said second electrode,
   voltage buffering means coupling said third electrode to said first electrode,
   a source of clamping potential coupled to said third electrode through a switch,
   whereby said CTD channel and said first and second electrodes create a charge bucket with charges therein and with a barrier formed by said second electrode responding to said reference signal, said second electrode responding to an input signal to change the barrier so as to provide positive feedback if said barrier is lowered, to transfer some charges over said barrier, said charge bucket thereby emptying over said barrier.

2. The combination of claim 1 further including output means coupled to said first electrode.

3. A signal comparator comprising:
   a CTD channel,
   a first electrode in said channel to form a preceding storage well,
   a second electrode in said channel following said first electrode to form a charge barrier for said preceding storage well,
   a floating electrode in said channel following said second electrode and coupled to said first electrode, and
   a source of signals coupled to said second electrode, whereby upon transfer of some charge carriers from said preceding storage well over said charge barrier under said floating electrode, a regenerative action causes the storage well to substantially empty its carriers over said barrier and under said floating electrode.

4. The combination of claim 3 further including a source of clamping potential and switching means coupled between said source of clamping potential and said floating electrode.

5. The combination of claim 3 in which said source of signals includes means for serially providing a reference signal and an input signal to said second electrode.

6. A CCD signal comparator comprising:
   a CCD channel,
   a floating electrode for establishing a receiving well,
   a charge storage electrode preceding said floating electrode along said channel, for establishing a charge well,
   electrode means between said charge storage electrode and said floating electrode for establishing a reference barrier,
   a source of potential coupled to said floating electrode, and
   means coupling said floating electrode and said charge storage electrode for providing regenerative feedback.

7. The combination of claim 6 further including a controllable source of charges in said channel preceding said charge well along said channel.

8. The combination of claim 7 in which said means coupling is a source follower.

9. The combination of claim 8 in which said source of potential is a switchable source of clamping potential.

10. The combination of claim 9 further including a source of signals coupled to said electrode means for selectively providing a reference potential and an input signal.

11. The combination of claim 10 further including output means coupled to said charge storage electrode.

12. A CCD signal comparator comprising:
a CCD channel,
a floating electrode in said channel for establishing a receiving well, a charge storage electrode in said channel for establishing a charge well,
said charge storage electrode coupled to said floating electrode,
a barrier electrode in said channel between said charge storage electrode and said floating electrode for establishing a barrier to the charge in said charge well,
a first source of potential coupled to said barrier electrode,
a second source of potential, and
switching means coupled between said second source of potential and said floating electrode.

13. The combination of claim 12 in which said first source of potential includes means for selectively providing a reference potential and an input signal.

14. The combination of claim 13 further including a source of charge in said channel upstream from said charge storage electrode.

15. The combination of claim 14 further including output means coupled to said charge storage electrode.

16. A charge comparator responsive to an input signal comprising:
a CCD channel,
first means for establishing a first well in said channel with a charge barrier and with charges therein, and responsive to said input signal to transfer a portion of the charges over said charge barrier,
second means for establishing a second well along said channel from said first well for receiving the charges transferred over said charge barrier, and
third means coupling said first and second means for providing regenerative feedback to said first means to transfer substantially all of the charges in said first well to the second well when a portion of the charges are transferred over said barrier.

* * * * *